United States Patent
Lee et al.

(10) Patent No.: US 7,301,233 B2
(45) Date of Patent: Nov. 27, 2007

(54) SEMICONDUCTOR CHIP PACKAGE WITH THERMOELECTRIC COOLER

(75) Inventors: Hae-Hyung Lee, Suwon-si (KR);
Sang-Wook Park, Seongnam-si (KR);
Joong-Hyun Baek, Suwon-si (KR);
Dong-Ho Lee, Seongnam-si (KR);
Jin-Yang Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 64 days.

(21) Appl. No.: 11/169,615

(22) Filed: Jun. 30, 2005

(65) Prior Publication Data

US 2006/0001140 A1 Jan. 5, 2006

(30) Foreign Application Priority Data

Jul. 1, 2004 (KR) .................. 10-2004-005127

(51) Int. Cl.
*H01L 23/34* (2006.01)
*H01L 23/10* (2006.01)
*H01L 23/02* (2006.01)

(52) U.S. Cl. .................. 257/719; 257/686; 257/706; 257/713; 257/E23.085

(58) Field of Classification Search ............... 257/719, 257/713, 686, 712, 706
See application file for complete search history.

(56) References Cited

U.S. PATENT DOCUMENTS 5,012,325 A * 4/1991 Mansuria et al. ........... 257/713
5,367,890 A * 11/1994 Doke ............................ 62/3.7
6,492,585 B1 * 12/2002 Zamboni et al. ............ 136/201
2002/0024154 A1 * 2/2002 Hara et al. .................. 257/930
2004/0245592 A1 * 12/2004 Harmon et al. ............. 257/438
2005/0077619 A1 * 4/2005 Ramanathan et al. ....... 257/719

FOREIGN PATENT DOCUMENTS

JP         2003-017638      1/2003
KR      1020020091792     12/2002
KR         2003-0011159    2/2003

OTHER PUBLICATIONS

Korean Office Action dated Feb. 6, 2006.

* cited by examiner

*Primary Examiner*—Nitin Parekh
(74) *Attorney, Agent, or Firm*—Harness, Dickey & Pierce, P.L.C.

(57) ABSTRACT

The semiconductor chip package may include a substrate having circuit patterns and substrate pads connected with the circuit patterns. At least one semiconductor chip is mounted on the substrate, and a thermoelectric cooler having a P-type material plate and an N-type material plate is mounted on the semiconductor chip. Portions of the P-type and N-type material plates may be attached on the semiconductor chip. The P-type and N-type material plates may be electrically connected to the circuit patterns of the substrate to be provided with DC power.

20 Claims, 7 Drawing Sheets

SEMICONDUCTOR CHIP PACKAGE WITH THERMOELECTRIC COOLER

CROSS REFERENCE TO RELATED APPLICATIONS

This U.S. non-provisional application claims priority under 35 U.S.C. §119 of Korean Patent Application No. 2004-51207, filed on Jul. 1, 2004, the entire contents of which are incorporated herein by reference.

BACKGROUND OF THE INVENTION

1. Field of the Invention

The present invention relates to a semiconductor device and, more particularly, to a semiconductor device having a thermoelectric cooler (TEC).

2. Description of the Related Art

With the development of semiconductor technology, and the pressing demand of users, recent trends in the electronics industry are towards minimization, light-weight construction and multi-function. To meet these demands, multi-chip packaging techniques have been introduced. Multi-chip packages (MCPs) include a plurality of semiconductor chips in a single package. MCPs manufactured by such techniques are advantageous in size, weight and mounting area over those including a plurality of packaged semiconductor chips.

FIG. 1 is a cross-sectional view of one example of a conventional semiconductor chip package.

Referring to FIG. 1, a semiconductor chip package 910 may be a multi-chip package including a plurality of semiconductor chips 911 and 913. Each of the semiconductor chips 911 and 913 may be an edge-pad-type semiconductor chip package. Bonding pads 912 and 914 may be arranged along the edges of the semiconductor chips 911 and 913, respectively. The semiconductor chips 911 and 913 may be stacked on a substrate 921.

The semiconductor chips 911 and 913 may be connected to, for example, terminals 93 on the substrate 921 by wires 931. A spacer 917 may be formed between the semiconductor chips 911 and 913. The spacer 917 may establish the height of the wire loop of the wire 931 of the semiconductor chip 911.

An encapsulant 961 may seal the semiconductor chips 911 and 913, the wires 931 and a connection portion. The encapsulant 961 may be formed of epoxy molding compound (EMC).

Solder balls 971 may be formed on the bottom surface of the substrate 921. The solder balls 971 may be used as external connection terminals.

The conventional semiconductor chip package may have several disadvantages caused by thermal stresses. For example, in case of a multi-chip package having a spacer between semiconductor chips, release of heat between the chips may be difficult to realize. In some instances, heat may accumulate between chips, which is referred to as the heat trapping phenomenon. As a result heat transfer from a semiconductor chip to a substrate through solder balls may be reduced.

With high-speed operation and high integration, the junction temperature of internal circuits of a semiconductor chip may increase, which may lead to an increased amount of heat generation. If the increased amount of generated heat is released poorly, in the case of electronic equipment using a semiconductor chip package such as a mobile product, characteristics of the semiconductor chip package such as refresh characteristics, operating speed and cycle life may decrease.

SUMMARY OF THE INVENTION

An exemplary embodiment of the present invention is directed to a semiconductor chip package which may release heat generated from a semiconductor chip to the external environment.

An exemplary embodiment of the present invention is directed to a semiconductor chip package which may prevent heat being trapped between semiconductor chips to improve thermal performance.

An exemplary embodiment of the present invention is directed to a semiconductor chip package which may enhance thermal performance corresponding to increased operating speed and high integration.

A semiconductor chip package with a thermoelectric cooler in accordance with an exemplary embodiment of the present invention may comprise a substrate, at least one semiconductor chip, and a thermoelectric cooler. The substrate may have circuit patterns, and substrate pads connected to the circuit patterns. The semiconductor chip may be mounted on the substrate. The thermoelectric cooler may include a P-type material plate and an N-type material plate. A portion of the P-type material plate may be connected with a portion of the N-type material plate on the semiconductor chip. The P-type and N-type material plates may be electrically connected to the circuit patterns of the substrate to be provided with direct current (DC) power.

In accordance with an exemplary embodiment of the present invention, the semiconductor chip may have bonding pads arranged along the edges thereof. The P-type and N-type material plates of the thermoelectric cooler may be formed clear of the bonding pads of the semiconductor chip.

In accordance with an exemplary embodiment of the present invention, the P-type and N-type material plates of the thermoelectric cooler may be arranged in the same or different directions, for example at 90 degrees, relative to the semiconductor chip.

In accordance with an exemplary embodiment of the present invention, the semiconductor chip package may include a plurality of semiconductor chips. The semiconductor chips may be stacked vertically on a substrate. The P-type and N-type material plates may be interconnected between adjacent semiconductor chips.

In accordance with an exemplary embodiment of the present invention, the semiconductor chip package may include a plurality of semiconductor chips. The semiconductor chips may be arranged horizontally on a substrate. At least one of the semiconductor chips may have an associated thermoelectric cooler. A portion of at least one of the P-type and N-type material plates forming the thermoelectric cooler may be attached on at least one semiconductor chip.

In accordance with an exemplary embodiment of the present invention, the P-type and N-type material plates may be connected with the substrate pad of the substrate directly or by a wire.

In accordance with an exemplary embodiment of the present invention, at least one of the P-type material plate or the N-type material plate may have a comb shaped portion. The comb shaped portion may be located on the semiconductor chip. Alternatively, the P-type and N-type material plates may have a plurality of individual parts. The individual parts of the P-type and N-type material plates may be connected in series. The connection may be made by a conductive material plate.

In accordance with an exemplary embodiment of the present invention, the semiconductor chip package may have a single semiconductor chip flip-chip bonded to the substrate. A portion of the thermoelectric cooler may be attached to the semiconductor chip.

In accordance with an exemplary embodiment of the present invention, the N-type material plate may be attached to the semiconductor chip and the P-type material plate may be attached to the N-type material plate. The N-type material plate may be connected to the anode and the P-type material plate may be connected to the cathode. Alternatively, the P-type material plate may be attached to the semiconductor chip and the N-type material plate may be attached to the P-type material plate. The N-type material plate may be connected to the cathode and the P-type material plate may be connected to the anode.

In accordance with an exemplary embodiment of the present invention, the semiconductor chip package may include two semiconductor chips stacked vertically. One of the N-type and P-type material plates may be attached to the lower semiconductor chip and the other may be attached to the upper semiconductor chip.

In accordance with an exemplary embodiment of the present invention, the semiconductor chip package may include three or more semiconductor chips stacked vertically. A thermoelectric cooler may be formed between each adjacent pair of semiconductor chips. The P-type and N-type material plates of each cooler may be respectively stacked on the same type material plates. For example, an N-type material plate may be stacked on another N-type material plate and a P-type material plate may be stacked on another P-type material plate.

A semiconductor chip package in accordance with another exemplary embodiment of the present invention may include a module-type package having a plurality of semiconductor chip packages mounted on a substrate. At least one semiconductor chip package may have a thermoelectric cooler with P-type and N-type plates. The P-type and N-type material plates may be electrically connected with circuit patterns of the substrate to be provided with DC power.

A semiconductor chip package with a thermoelectric cooler in accordance with still another exemplary embodiment of the present invention may include a module-type package having a plurality of semiconductor chip packages mounted on a substrate. Each semiconductor chip package may comprise a semiconductor chip, a substrate and an encapsulant. The semiconductor chip may be mounted on the substrate. The substrate may have circuit patterns. The encapsulant may protect the semiconductor chip. At least one semiconductor chip package may have a P-type material plate and an N-type material plate thereon. A portion of one of the P-type and N-type material plates may be attached to the encapsulant. The P-type and N-type material plates may be electrically connected with circuit patterns of the substrate to be provided with DC power.

In another embodiment, a method of forming a semiconductor package is provided. The method includes mounting a semiconductor chip on a substrate, and mounting a thermoelectric cooler having an N-type material plate and a P-type material plate on the semiconductor chip such that portions of the N-type and P-type material plates extend from the semiconductor chip and electrically connect circuit patterns of the substrate.

BRIEF DESCRIPTION OF THE DRAWINGS

These and other features and advantages of the exemplary embodiments of the present invention will be readily understood with reference to the following detailed description thereof provided in conjunction with the accompanying drawings, wherein like reference numerals designate like structural elements, and in which.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the exemplary embodiments of the invention.

DETAILED DESCRIPTION OF THE EXEMPLARY EMBODIMENTS

The present invention will now be described more fully hereinafter with reference to the accompanying drawings, in which exemplary embodiments of the invention are illustrated. This invention may, however, be embodied in many different forms and should not be construed as limited to the particular embodiments set forth herein. Rather, these embodiments are provided so that this disclosure will be thorough and complete, and will fully convey the scope of the invention to those skilled in the art.

In the description, well-known structures and processes have not been described or illustrated in detail to avoid obscuring the present invention. It will be appreciated that for simplicity and clarity of illustration, some elements illustrated in the figures have not necessarily been drawn to scale. For example, the dimensions of some of the elements have been exaggerated or reduced relative to other elements for clarity.

Figure 1:
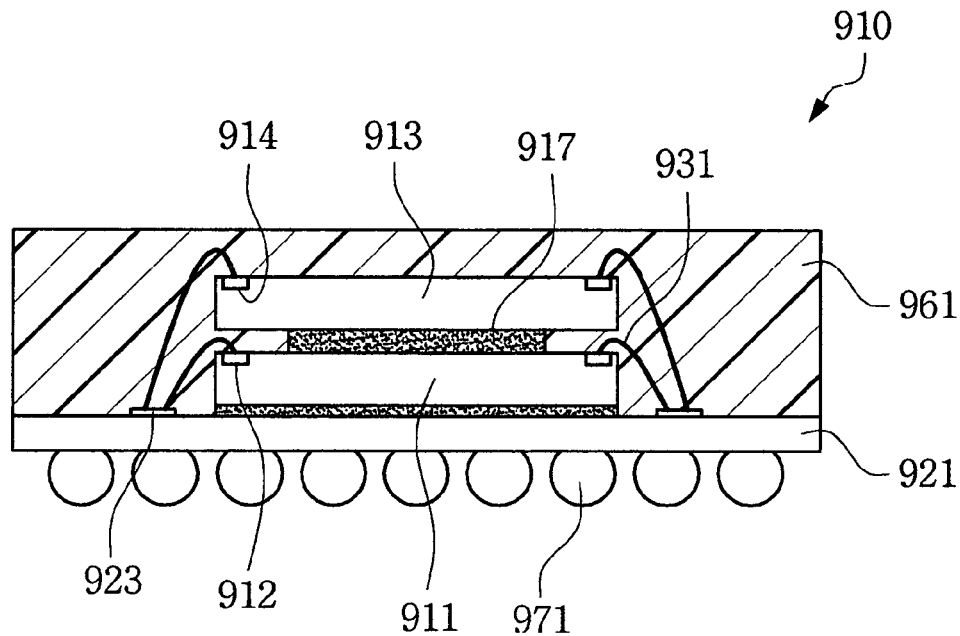
FIG. 1 is a cross-sectional view of one example of a conventional semiconductor chip package.
Figure 2:
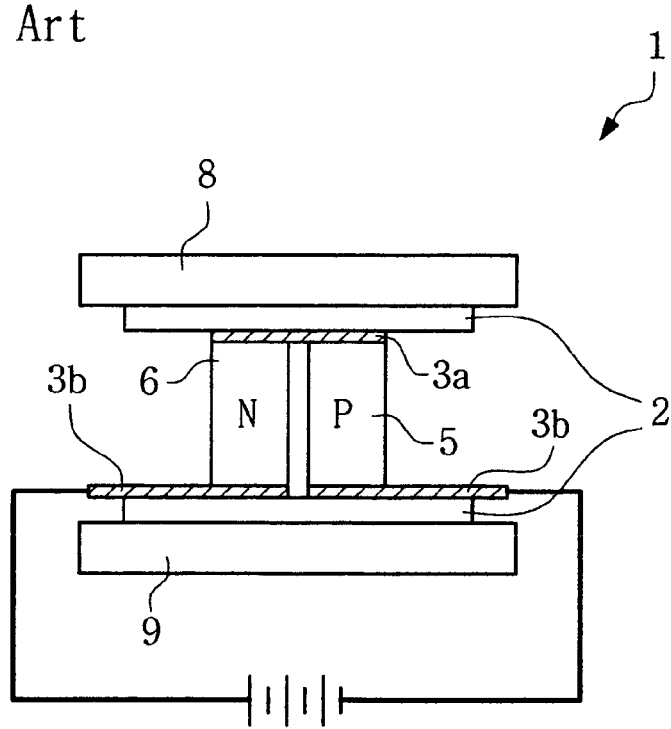
FIG. 2 is a schematic view of a typical thermoelectric cooler.

FIG. 2 is a schematic view of a typical thermoelectric cooler.

Referring to FIG. 2, the principle of a thermoelectric cooler 1 may be based on the Peltier Effect. According to the Peltier Effect, when DC power is applied to two different materials, heat may be absorbed at the junction of the materials. A thermoelectric cooler 1 may include a P-type semiconductor 5 and an N-type semiconductor 6. The P-type and N-type semiconductors 5 and 6 may be formed between opposing electrical insulators 2 and opposing electrical conductors 3a and 3b. The electrical insulator 2 may have a good thermal conducting property but a poor electrical conducting property. The N-type semiconductor 6 may have excessive electrons while the P-type semiconductor 5 may have insufficient electrons. When DC power is applied between the electrical conductors 3b, electrons may move from the electrical conductors 3b to the N-type semiconductor 6. The energy state of electrons may rise due to heat energy absorbed from a heat source 8. Therefore, heat energy may transfer from the heat source 8 to a heat sink 9 via electrons flowing through the N-type semiconductor 6 and the electrical conductors 3a and 3b. Electrons may then change to a low energy state and be released as heat energy at the electrical conductor 3b.

When materials having P-type and N-type characteristics are connected in series and DC power is applied to the materials, a temperature differential may occur between the heat source 8 and the heat sink 9. The thermoelectric cooler 1 may serve as an electric heat pump to transfer heat from the heat source 8 to the heat sink 9.

Figure 3:
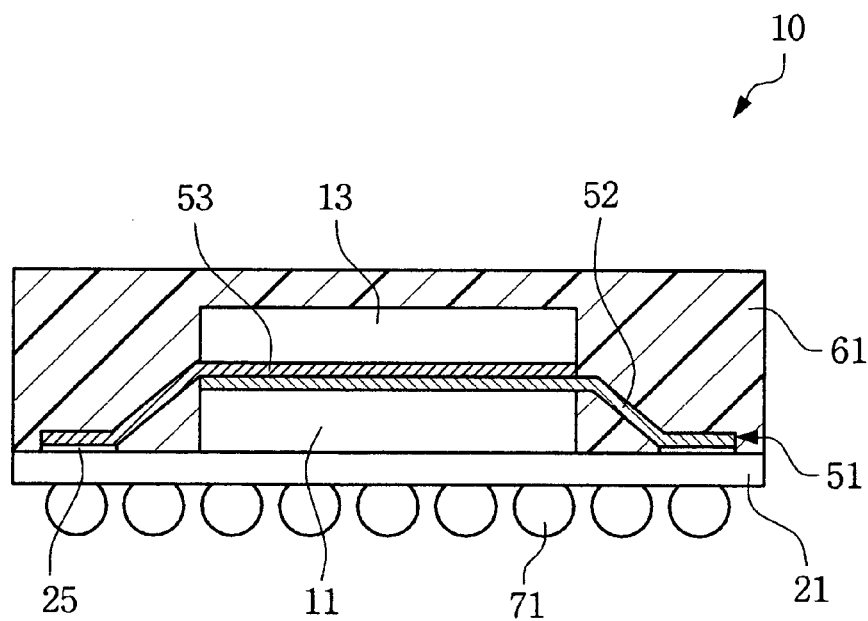
FIG. 3 is a cross-sectional view of a semiconductor chip package in accordance with a first exemplary embodiment of the present invention.
Figure 4:
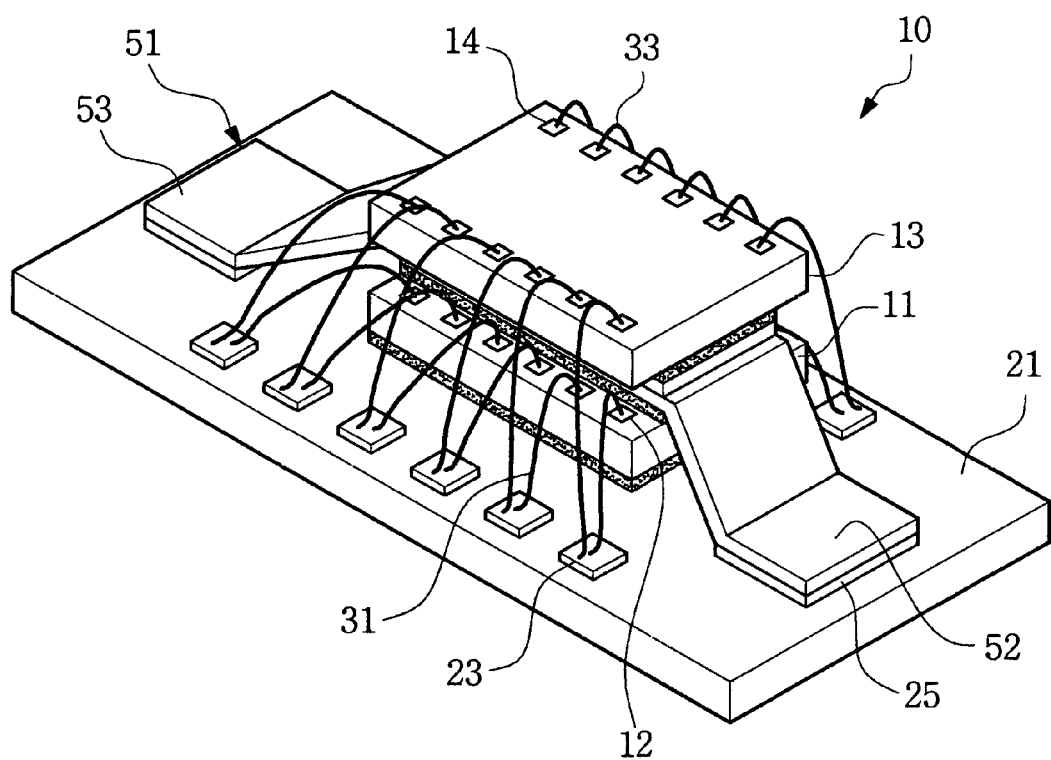
FIG. 4 is a perspective view of a semiconductor chip package before a molding process in accordance with a first exemplary embodiment of the present invention.
Figure 5A:
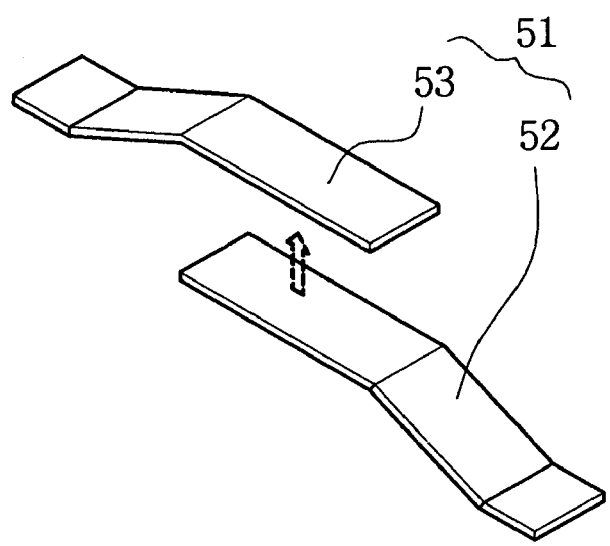
FIGS. 5A through 5C are views of various thermoelectric cooler structures in accordance with an exemplary embodiment of the present invention.
Figure 5B:
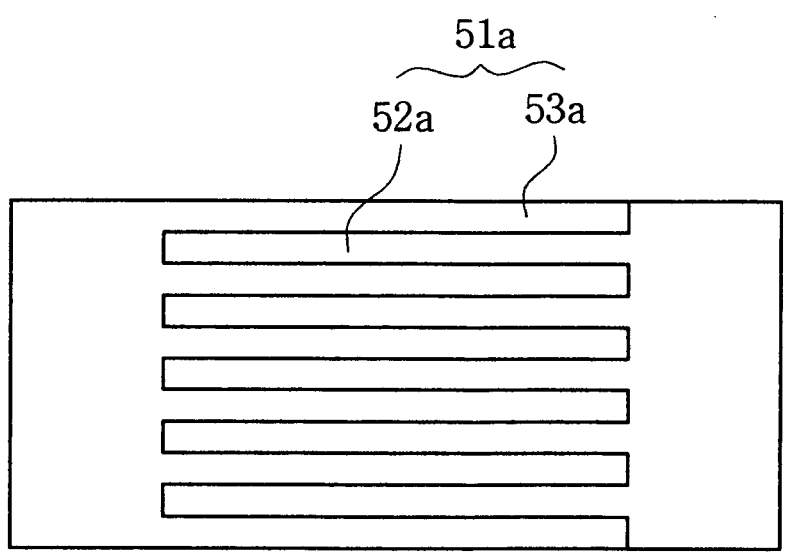
Figure 5C:
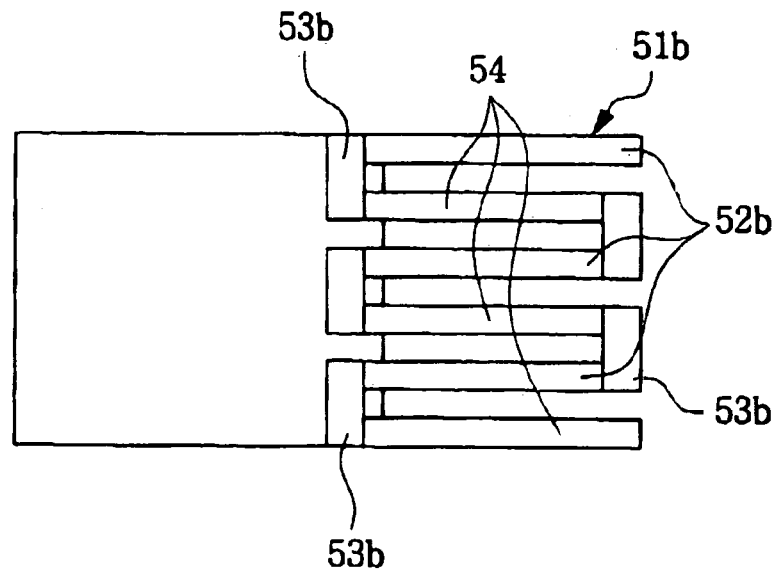

FIG. 3 is a cross-sectional view of a semiconductor chip package in accordance with a first exemplary embodiment of the present invention. FIG. 4 is a perspective view of a semiconductor chip package before a molding process in accordance with a first exemplary embodiment of the present invention. FIGS. 5A through 5C are views of various thermoelectric cooler structures in accordance with an exemplary embodiment of the present invention.

Referring to FIGS. 3 and 4, a semiconductor chip package 10 may be a multi-chip package having semiconductor chips 11 and 13. The semiconductor chips 11 and 13 may be stacked on a substrate 21. The semiconductor chip 11 may be hereinafter referred to as a first semiconductor chip and the semiconductor chip 13 may be hereinafter referred to as a second semiconductor chip. A thermoelectric cooler 51 may be formed between the first and second semiconductor chips 11 and 13. The first and second semiconductor chips 11 and 13 may be electrically connected with the substrate 21 by wires 31 and 33. An encapsulant 61 may protect the first and second semiconductor chips 11 and 13, the wires 31 and 33 and a connection portion from the external environment. Solder balls 71 may be formed as external connection terminals on the substrate 21.

The substrate 21 may have circuit patterns (not shown) and substrate pads 23 and 25 connected with the circuit patterns. The substrate 21 may include a printed circuit board and a tape wiring substrate.

The first and second semiconductor chips 11 and 13 may be of the same kind of semiconductor chips as each other or different. The first and second semiconductor chips 11 and 13 may be edge-pad-type semiconductor chips, on which bonding pads are arranged along the edges. The first and second semiconductor chips 11 and 13 may be mounted on one surface of the substrate 21 such that the bonding pad-forming surfaces may face upward. The bonding pads 12 and 14 of the semiconductor chips 11 and 13 may be connected with corresponding substrate pads 23 of the substrate 21 by the wires 31 and 33, respectively. The semiconductor chips 11 and 13 may be attached using a well known epoxy resin adhesive.

The thermoelectric cooler 51 may be formed between the first and second semiconductor chips 11 and 13. The thermoelectric cooler 51 may include an N-type material plate 52 and a P-type material plate 53. A portion of the N-type material plate 52 may be joined to a portion of the P-type material plate 53. The N-type material plate 52 may be attached to the first semiconductor chip 11 and the P-type material plate 53 may be attached to the second semiconductor chip 13. The N-type material plate 52 may use an N-type semiconductor and the P-type material plate 53 may use a P-type semiconductor. The N-type material plate 52 and the P-type material plate 53 may be joined using an electrical conductive adhesive.

The N-type and P-type material plates 52 and 53 of the thermoelectric cooler 51 may be arranged clear of the wires 31 and 33 and bonding pads 12 and 14 of the semiconductor chips 11 and 13. Portions of the N-type material plate 52 and the P-type material plate 53 may be bent suitably to be attached on the substrate 21. The N-type and P-type material plates 52 and 53 may be electrically connected with the substrate pads 25 of the substrate 21 to be provided with DC power. The N-type material plate 52 may be connected with an anode and the P-type material plate 53 may be connected with a cathode.

A joint portion between the N-type and P-type material plates 52 and 53 may be a cold side. A joint portion between the N-type and P-type material plates 52 and 53 and the substrate 21 may be a hot side. When DC power is applied to the N-type and P-type material plates 52 and 53, heat energy may be absorbed at the cold side while it may concentrate on and be released at the hot side. The heat energy may be transferred to the solder balls 71 through the substrate 21. The thickness of the thermoelectric cooler 51 may be sufficient to establish the height of the wire loop of the wire 31 of the first semiconductor chip 11.

Referring to FIGS. 5A through 5C, the N-type and P-type material plates 52 and 53 may be formed in the shape of rectangular plates. The N-type and P-type material plates 52 and 53 may be connected over the entire surface between the semiconductor chips 11 and 13, shown in FIG. 5A. Alternatively, the N-type and P-type material plates 52a and 53a may have an irregular portion, as shown in FIG. 5B. Namely, FIG. 5B shows the N-type and P-type material plates 52a and 53a may each have a comb shape interdigitating with one another. Or the N-type and P-type material plates 52 and 53 may include individual parts as shown in FIG. 5C. The individual parts of the N-type and P-type material plates 52 and 53 may be connected in series by a conductive material plate 54. Joint portions between the individual parts of the N-type and P-type material plates 52 and 53 may be located at portions of a semiconductor chip.

The thermoelectric cooler 51 of FIGS. 5B and 5C may adjust the location and area of the joint portion between the N-type and P-type material plates 52 and 53. Therefore, the temperature may be controlled at these portions. For example, a joint portion may be located at a heat generating portion of a semiconductor chip, and heat may be released at the heat generating portion of the semiconductor chip because of the joint's location, thereby maintaining a uniform temperature.

The N-type material plate 52 may be attached to the first semiconductor chip 11 and the P-type material plate 53 may be attached to the second semiconductor chip 13. In this case, the P-type material plate 53 may be connected with an anode and the N-type material plate 52 may be connected with a cathode.

The encapsulant 61 may seal the first and second semiconductor chips 11 and 13, the wires 31 and 33 and a connection portion to protect them from the external environment. The encapsulant 61 may be formed of EMC. The solder balls 71 may be connected with the substrate pads 25 of the substrate 21. The solder balls 71 may serve as external connection terminals.

Figure 6:
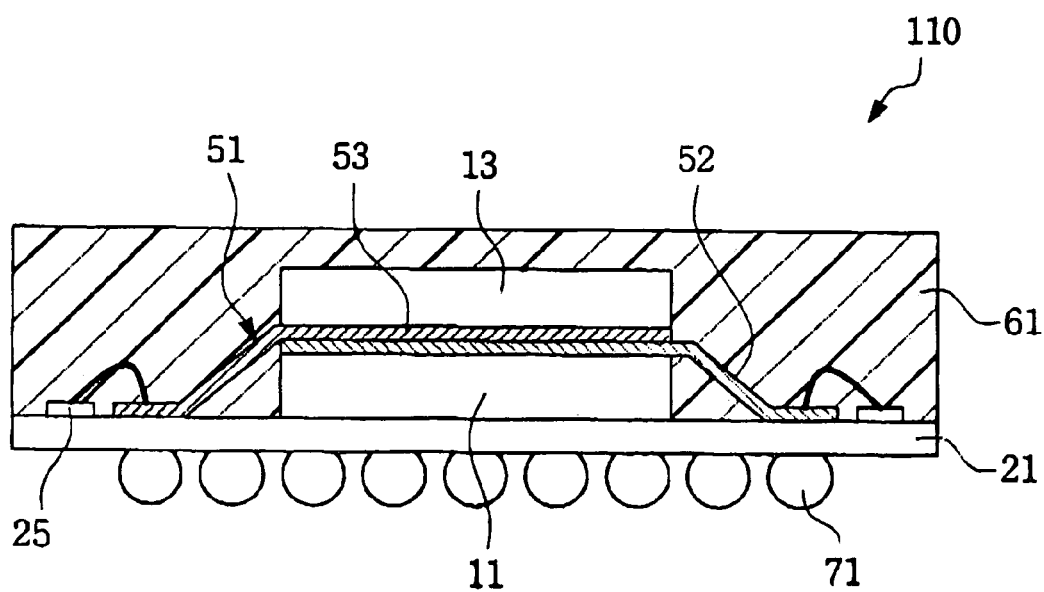
FIG. 6 is a cross-sectional view of a semiconductor chip package in accordance with a second exemplary embodiment of the present invention.

FIG. 6 is a cross-sectional view of a semiconductor chip package in accordance with a second exemplary embodiment of the present invention.

Referring to FIG. 6, a semiconductor chip package 110 may have the same structure as that of the first exemplary embodiment except for that the N-type and P-type material plates 52 and 53 are wire-bonded to substrate pads 25 of a substrate 21. This exemplary embodiment shows a modification in a structure to connect the N-type and P-type material plates 52 and 53 with the substrate pads 25 of the substrate 21.

Figure 7:
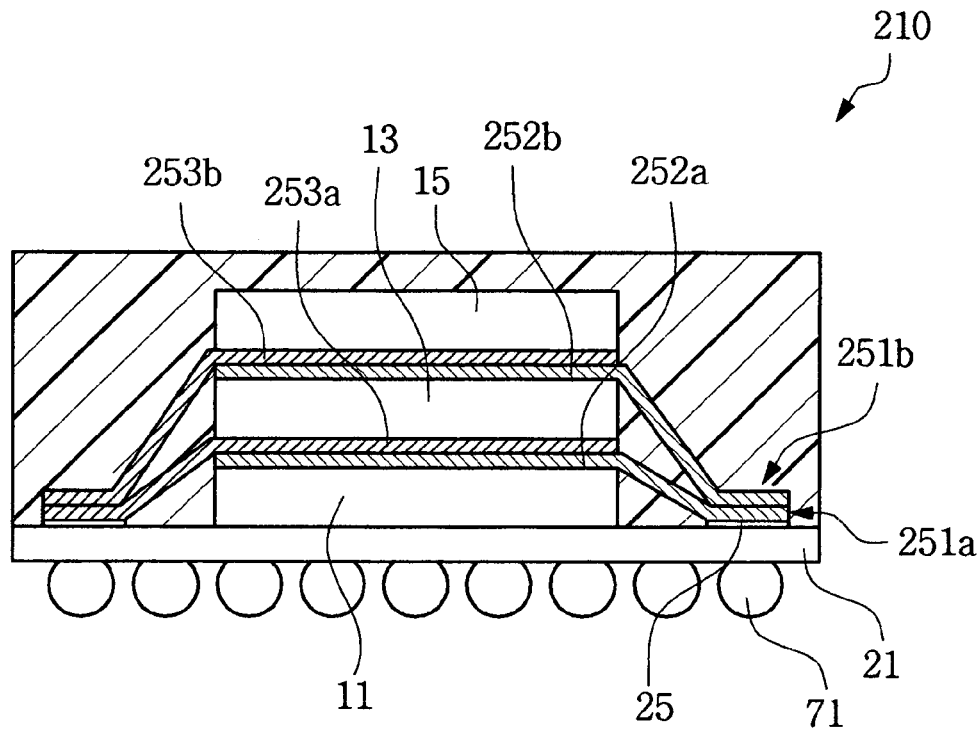
FIG. 7 is a cross-sectional view of a semiconductor chip package in accordance with a third exemplary embodiment of the present invention.

FIG. 7 is a cross-sectional view of a semiconductor chip package in accordance with a third exemplary embodiment of the present invention.

Referring to FIG. 7, a semiconductor chip package 210 may have three semiconductor chips 11, 13 and 15. This exemplary embodiment shows a multi-chip package structure having two or more semiconductor chips.

A thermoelectric cooler 251a may be formed between adjacent semiconductor chips 11 and 13 and a thermoelectric cooler 251b may be formed between adjacent semiconductor chips 13 and 15. Hence, N-type material plate 252a and P-type material plate 253a may be formed between the first and second semiconductor chips 11 and 13 and N-type material plate 252b and P-type material plate 253b may be formed between the second and third semiconductor chips 13 and 15. Heat may be transferred from the semiconductor chips 11, 13 and 15 to solder balls 71 through the substrate 21 by the thermoelectric coolers 251a and 251b.

Although this exemplary embodiment shows the thermoelectric coolers 251a and 251b may be stacked outside the semiconductor chips 11, 13 and 15, the thermoelectric coolers 251a and 251b may be separated outside the semiconductor chips 11, 13 and 15. This may allow control of DC power to each thermoelectric cooler 251a and 251b separately, thereby individually maintaining the operating temperature of the semiconductor chips 11, 13 and 15. For example, when a plurality of semiconductor chips having different maximum operating temperatures, such as a microprocessor and a RAM, are stacked within a single package, the temperature of each semiconductor chip may be separately controllable.

Figure 8A:
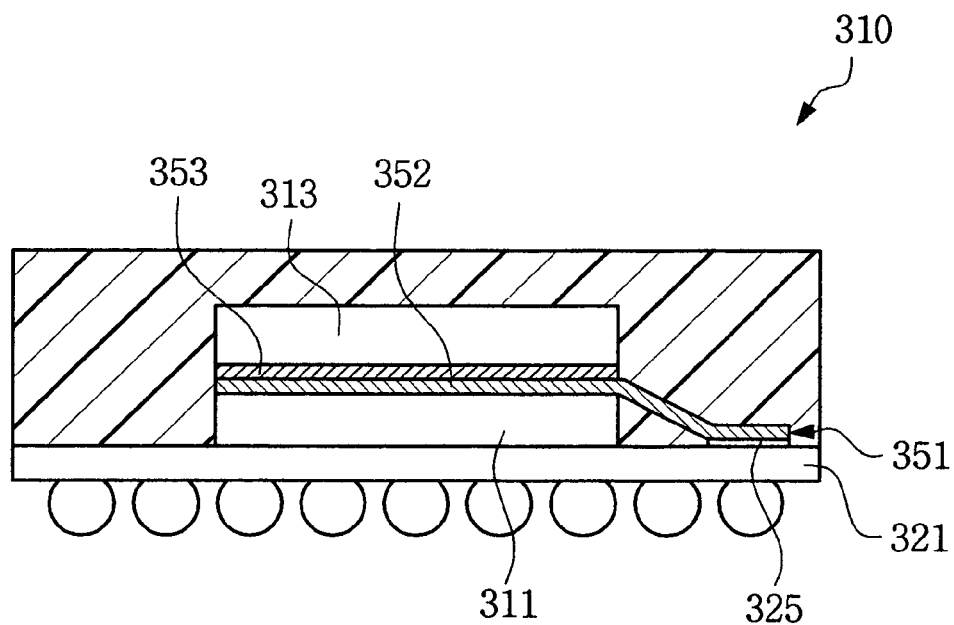
FIG. 8A is a cross-sectional view of a semiconductor chip package in accordance with a fourth exemplary embodiment of the present invention.
Figure 8B:
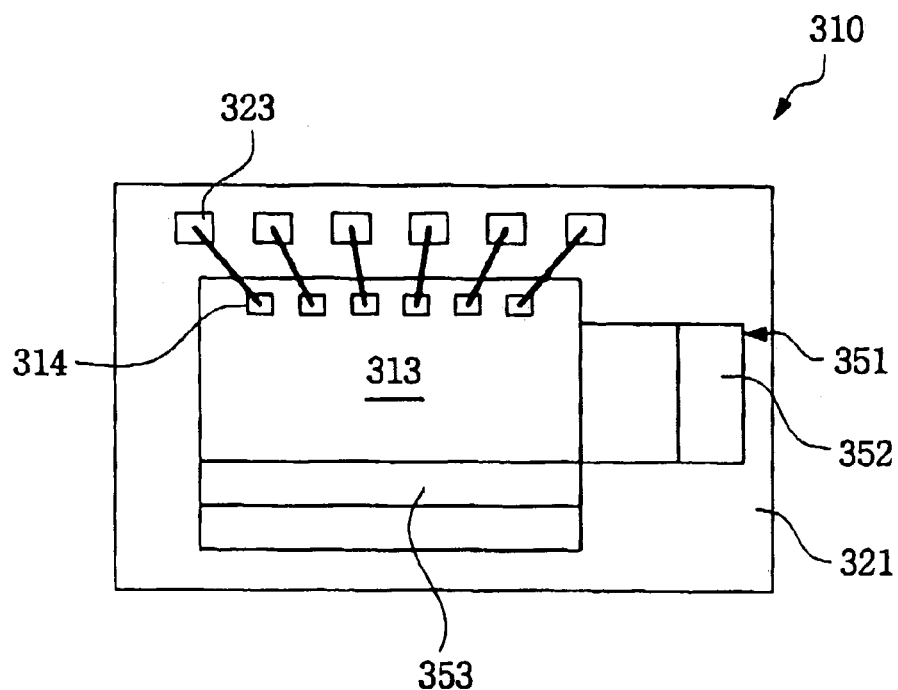
FIG. 8B is a plan view of a semiconductor chip package before a molding process in accordance with a fourth exemplary embodiment of the present invention.

FIG. 8A is a cross-sectional view of a semiconductor chip package in accordance with a fourth exemplary embodiment of the present invention. FIG. 8B is a plan view of a semiconductor chip package before a molding process in accordance with a fourth exemplary embodiment of the present invention.

Referring to FIGS. 8A and 8B, a semiconductor chip package 310 may be a multi-chip package having two semiconductor chips 311 and 313. The semiconductor chip package 310 may be different from that of the first exemplary embodiment in that N-type and P-type material plates 352 and 353 may be arranged 90 degrees with respect to one another.

This exemplary embodiment shows free arrangement of a hot side of a thermoelectric cooler. Specifically, the N-type and P-type material plates 352 and 353 may be arranged at a good heat release portion of a substrate 321. The N-type and P-type material plates 352 and 353 may be arranged in the same direction as well as in different directions. In the case that the N-type and P-type material plates 352 and 353 may be arranged in the same or different directions, bonding pads 314 of the semiconductor chips 311 and 313 may be arranged clear of the N-type and P-type material plates 352 and 353. Bonding pads 314 may be wire bonded to substrate pads 323, while the N-type and P-type material plates 352 and 353 may be connected to substrate pads 325. Portions of the N-type and P-type material plates 352 and 353 outside of the semiconductor chip 313 may be sized and spaced so as not to be in contact.

Figure 9:
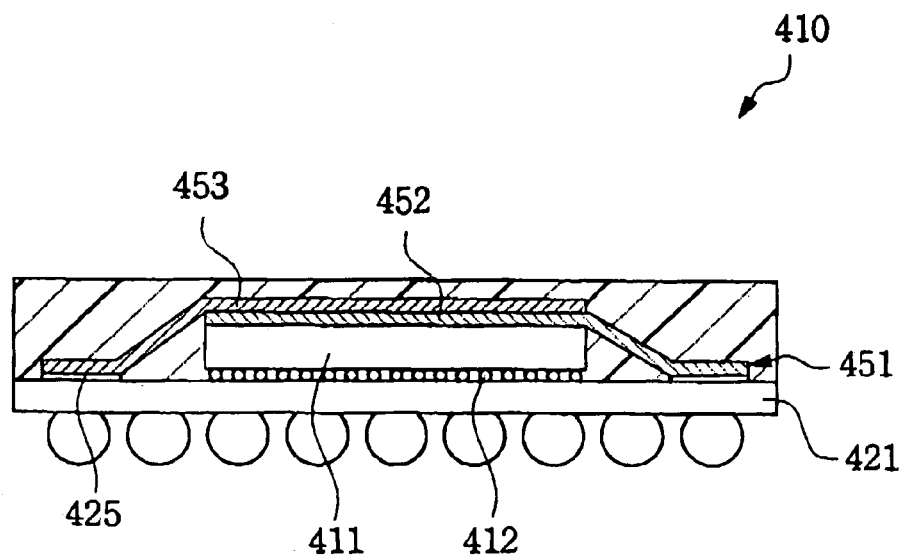
FIG. 9 is a cross-sectional view of a semiconductor chip package in accordance with a fifth exemplary embodiment of the present invention.

FIG. 9 is a cross-sectional view of a semiconductor chip package in accordance with a fifth exemplary embodiment of the present invention.

Referring to FIG. 9, a semiconductor chip package 410 may have a semiconductor chip 411 flip-chip bonded to a substrate 421. The semiconductor chip 411 may be electrically connected to the substrate 421 by bumps 412. An N-type material plate 452 may be attached to the semiconductor chip 411. A P-type material plate 453 may be attached to the N-type material plate 452. Portions of the N-type and P-type material plates 452 and 453 may be attached to substrate pads 425 on the substrate 421 to be provided with DC power.

Figure 10:
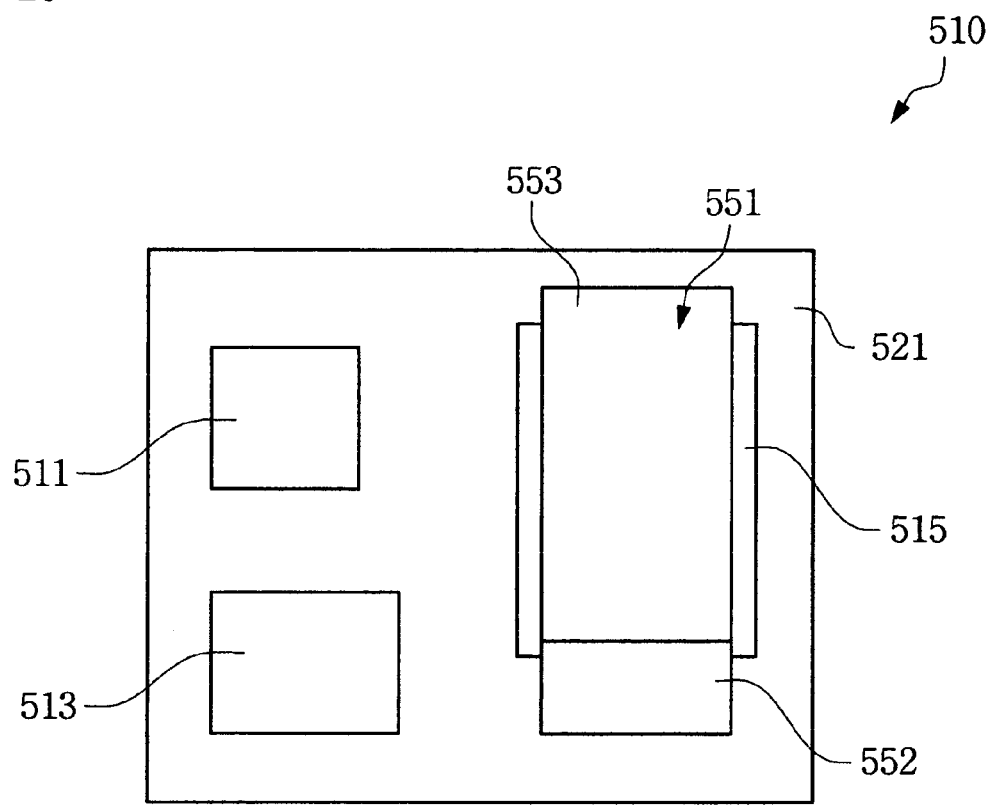
FIG. 10 is a plan view of a semiconductor chip package before a molding process in accordance with a sixth exemplary embodiment of the present invention.

FIG. 10 is a plan view of a semiconductor chip package before a molding process in accordance with a sixth exemplary embodiment of the present invention.

Referring to FIG. 10, a semiconductor chip package 510 may have a plurality of semiconductor chips 511, 513 and 515. The semiconductor chips 511, 513 and 515 may be arranged horizontally on a substrate 521. The semiconductor chip 511 may be hereinafter referred to as a first semiconductor chip. The semiconductor chip 513 may be hereinafter referred to as a second semiconductor chip. The semiconductor chip 515 may be hereinafter referred to as a third semiconductor chip. The third semiconductor chip 515 may have a thermoelectric cooler 551. This exemplary embodiment shows thermal interference, which may occur between the semiconductor chips 511, 513 and 515, may be prevented.

The third semiconductor chip 515 may have a higher operating temperature than the first and second semiconductor chips 511 and 513. An N-type material plate 552 may be attached on the third semiconductor chip 515. A P-type material plate 553 may be attached on the N-type material plate 552. Portions of the N-type and P-type material plates 552 and 553 may be attached to the substrate 521. Heat, which may occur during operation of the third semiconductor chip 515, may influence adjacent semiconductor chips 511 and 513. The thermoelectric cooler 551 may reduce the temperature during normal operation of the third semiconductor chip 515 and release the generated heat.

Figure 11:
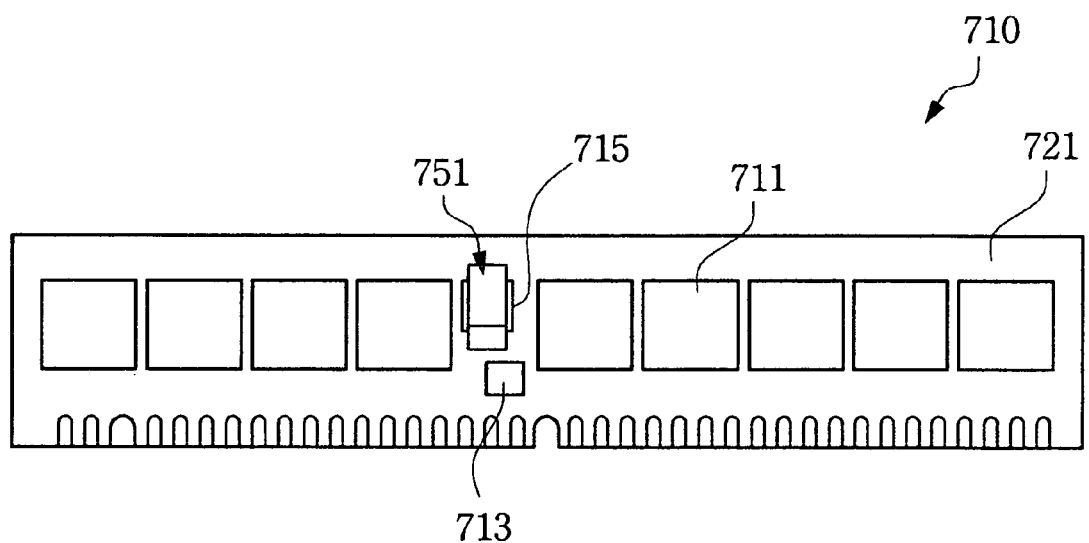
FIG. 11 is a plan view of a semiconductor chip package in accordance with a seventh exemplary embodiment of the present invention.

FIG. 11 is a plan view of a semiconductor chip package in accordance with a seventh exemplary embodiment of the present invention.

Referring to FIG. 11, a semiconductor chip package 710 may be a memory module having a plurality of semiconductor chip packages 711, 713 and 715. The semiconductor chip packages 711, 713 and 715 may be mounted on a substrate 721. A specific semiconductor chip package 715 may have higher operating temperature than the other semiconductor chip packages 711 and 713. The semiconductor chip package 715 may have a thermoelectric cooler 751. The thermoelectric cooler 751 may reduce the operating temperature of the semiconductor chip package 715. The thermoelectric cooler 751 may prevent the thermal interference which may occur between adjacent semiconductor chip packages 711, 713 and 715. Heat may be released through the substrate 721, thereby allowing stable operating characteristics of the semiconductor chip packages 711 and 713.

A semiconductor chip package in accordance with exemplary embodiments of the present invention includes a thermoelectric cooler that may release heat, thereby improving thermal characteristics of the package. The semiconductor chip package may prevent heat being trapped between semiconductor chips. Further, the semiconductor chip package may enhance thermal performance corresponding to increased operating speed and high integration.

Although the exemplary embodiments of the present invention have been described in detail hereinabove, it should be understood that many variations and/or modifications of the basic inventive concepts herein taught, which may appear to those skilled in the art, will still fall within the spirit and scope of the exemplary embodiments of the present invention.

What is claimed is:

1. A semiconductor chip package comprising:
   at least one semiconductor chip mounted on a substrate; and
   at least one thermoelectric cooler including a P-type material plate and an N-type material plate, a portion of the P-type material plate being connected with a portion of the N-type material plate on the semiconductor chip, a portion of the P-type and N-type material plates disposed directly on the substrate, the P-type and N-type material plates being electrically connected to circuit patterns of the substrate being provided with DC power.

2. The semiconductor chip package of claim 1, wherein the semiconductor chip has bonding pads arranged along the opposing edges and the P-type and N-type material plates are arranged clear of the bonding pads of the semiconductor chip.

3. The semiconductor chip package of claim 1, wherein the thermoelectric cooler has the P-type and N-type material plates arranged at 90 degrees to one another.

4. The semiconductor chip package of claim 1, wherein the thermoelectric cooler has the P-type and N-type material plates arranged in the same direction relative to the semiconductor chip.

5. The semiconductor chip package of claim 1, wherein a plurality of semiconductor chips are stacked on the substrate and a thermoelectric cooler is formed between at least two adjacent pairs of semiconductor chips, portions of the P-type material plates forming the thermoelectric coolers are connected to each other, and portions of the N-type material plates forming the thermoelectric coolers are connected to each other.

6. The semiconductor chip package of claim 1, wherein a plurality of semiconductor chips are horizontally arranged on the substrate and a portion of at least any one of the P-type and N-type material plates is attached on at least one semiconductor chips.

7. The semiconductor chip package of claim 1, wherein the thermoelectric cooler has the P-type and N-type material plates connected to substrate pads of the substrate.

8. The semiconductor chip package of claim 7, wherein the thermoelectric cooler has the P-type and N-type material plates connected to substrate pads of the substrate by wires.

9. The semiconductor chip package of claim 7, wherein the thermoelectric cooler has the P-type and N-type material plates disposed on and connected to substrate pads of the substrate directly.

10. The semiconductor chip package of claim 1, wherein at least one of the P-type and N-type material plates has a comb shaped portion and the comb shaped portion is located on the semiconductor chip.

11. The semiconductor chip package of claim 1, wherein the thermoelectric cooler has the P-type and N-type material plates that include individual parts and the individual parts of the P-type and N-type material plates are electrically connected in series.

12. The semiconductor chip package of claim 11, wherein the individual parts of the P-type and N-type material plates are connected by a conductive material plate.

13. The semiconductor chip package of claim 1, wherein a single semiconductor chip is connected to the substrate by bumps and a portion of the thermoelectric cooler is attached on the semiconductor chip.

14. The semiconductor chip package of claim 1, wherein the thermoelectric cooler has the N-type material plate attached on the semiconductor chip and the P-type material plate attached on the N-type material plate, and the N-type material plate is connected to an anode and the P-type material plate is connected to a cathode.

15. The semiconductor chip package of claim 1, wherein the thermoelectric cooler has the P-type material plate attached on the semiconductor chip and the N-type material plate attached on the P-type material plate, and the P-type material plate is connected to an anode and the N-type material plate is connected to a cathode.

16. The semiconductor chip package of claim 1, wherein two semiconductor chips are stacked on the substrate and one of the N-type and P-type material plates is attached on a lower of the two semiconductor chips and one of the N-type and P-type material plates is attached on an upper of the two semiconductor chips.

17. The semiconductor chip package of claim 1, wherein three or more semiconductor chips are stacked on the substrate and a thermoelectric cooler is formed between more than one pair of adjacent semiconductor chips.

18. The semiconductor chip package of claim 17, wherein portions of the N-type material plates outside the semiconductor chip are stacked on one of the N-type material plates, and portions of the P-type material plates outside the semiconductor chip are stacked on one of the P-type material plates.

19. A module-type package having a plurality of semiconductor chip packages, at least one of the semiconductor chip packages being the semiconductor chip package of claim 1.

20. A module-type package having a plurality of semiconductor chip packages, each package comprising:
   at least one semiconductor chip;
   a substrate having circuit patterns and the semiconductor chip mounted thereon; and
   an encapsulant sealing the semiconductor chip;
   at least one of the semiconductor chip packages being the semiconductor chip package of claim 1.

* * * * *